United States Patent [19]

Young

[11] Patent Number: 4,644,275

[45] Date of Patent: Feb. 17, 1987

[54] NUCLEAR MAGNETIC RESONANCE APPARATUS

[75] Inventor: Ian R. Young, Sunbury-on-Thames, England

[73] Assignee: Picker International Limited, Middlesex, England

[21] Appl. No.: 691,669

[22] Filed: Jan. 15, 1985

[30] Foreign Application Priority Data

Jan. 20, 1984 [GB] United Kingdom ................ 8401550

[51] Int. Cl.$^4$ ............................................ G01R 33/20
[52] U.S. Cl. .................................... 324/307; 324/318
[58] Field of Search ............... 324/307, 300, 306, 309, 324/312, 313, 318, 319, 322, 308

[56] References Cited

U.S. PATENT DOCUMENTS

| | | | |
|---|---|---|---|
| 3,932,805 | 1/1976 | Abe et al. ........................... | 324/309 |
| 4,411,270 | 10/1983 | Damadian ....................... | 324/309 X |
| 4,531,093 | 7/1985 | Rollwitz et al. .................... | 324/306 |
| 4,573,015 | 2/1986 | Abe et al. ........................... | 324/309 |

FOREIGN PATENT DOCUMENTS

| | | |
|---|---|---|
| 0108421 | 8/1983 | European Pat. Off. . |
| 1135332 | 3/1966 | United Kingdom . |
| 2052069 | 3/1980 | United Kingdom . |
| 2056078 | 7/1980 | United Kingdom . |
| 2101327 | 12/1981 | United Kingdom . |
| 2125632A | 8/1982 | United Kingdom . |
| 2128745A | 8/1983 | United Kingdom . |

*Primary Examiner*—Stephen A. Kreitman
*Assistant Examiner*—Scott M. Oldham
*Attorney, Agent, or Firm*—Watts, Hoffmann, Fisher & Heinke Co.

[57] ABSTRACT

An NMR apparatus capable of being used for both chemical analysis and imaging of a body without adjustment of the magnetic field strength of the magnet system used to define the equilibrium axis of magnetic alignment of the nuclei within the body. The apparatus incorporates two magnet systems each capable of independently defining an equilibrium axis of magnetic alignment for nuclei within a body to be examined by NMR techniques.

8 Claims, 2 Drawing Figures

NUCLEAR MAGNETIC RESONANCE APPARATUS

BACKGROUND OF THE INVENTION

1. Field of the Invention

This invention relates to nuclear magnetic resonance (NMR) apparatus.

NMR apparatus of the kind capable of performing chemical analysis of a body by spectroscopy have been known for many years. More recently NMR apparatus have been developed which are of a kind capable of imaging a body to provide a representation of the distribution, over a selected cross-sectional slice or volume of the body, of a chosen quantity, for example the density of chosen nuclei such as hydrogen protons or of NMR spin relaxation time constants.

2. Description of Related Art

In some applications it would be useful to be able to perform the chemical analysis of a body, and the imaging of the body on the same NMR apparatus. In practice, however, whilst both kinds of NMR apparatus described above require a magnet system capable of providing a static magnetic field which is used to define the equilibrium axis of magnetic alignment of the nuclei within the body, the static magnetic fields which are required in the two different kinds of apparatus for optimum performance are different. Thus, in an NMR apparatus to be used for both chemical analysis and imaging techniques it is necessary to adjust the magnet system to produce a different field strength for use in each technique. The requirement for adjustment of the magnet system presents several practical difficulties, as adjustment of the magnetic field strength necessitates the realignment of the rest of the apparatus which is both time consuming and difficult. These difficulties are exacerbated where a cryogenic magnet system is being used as such as magnet system should ideally be allowed to run uninterrupted.

SUMMARY OF THE INVENTION

It is an object of the present invention to provide an NMR apparatus which may be made to be suitable for both chemical analysis of a body and for imaging of the body.

According to the present invention an NMR apparatus includes at least two magnet systems, each capable of independently defining an equilibrium axis of magnetic alignment for nuclei within a body to be examined by NMR techniques, the strengths of the magnetic fields produced by the systems in operation being different.

BRIEF DESCRIPTION OF THE DRAWINGS

One NMR apparatus in accordance with the invention will now be described, by way of example only, with reference to the accompanying drawings in which.

DESCRIPTION OF THE PREFERRED EMBODIMENT

The apparatus is an adaptation of an NMR imaging apparatus such as that described in UK Patent Specification No. 1,578,910 or No. 2,056,078 to which reference should be made for a fuller description.

Figure 1:
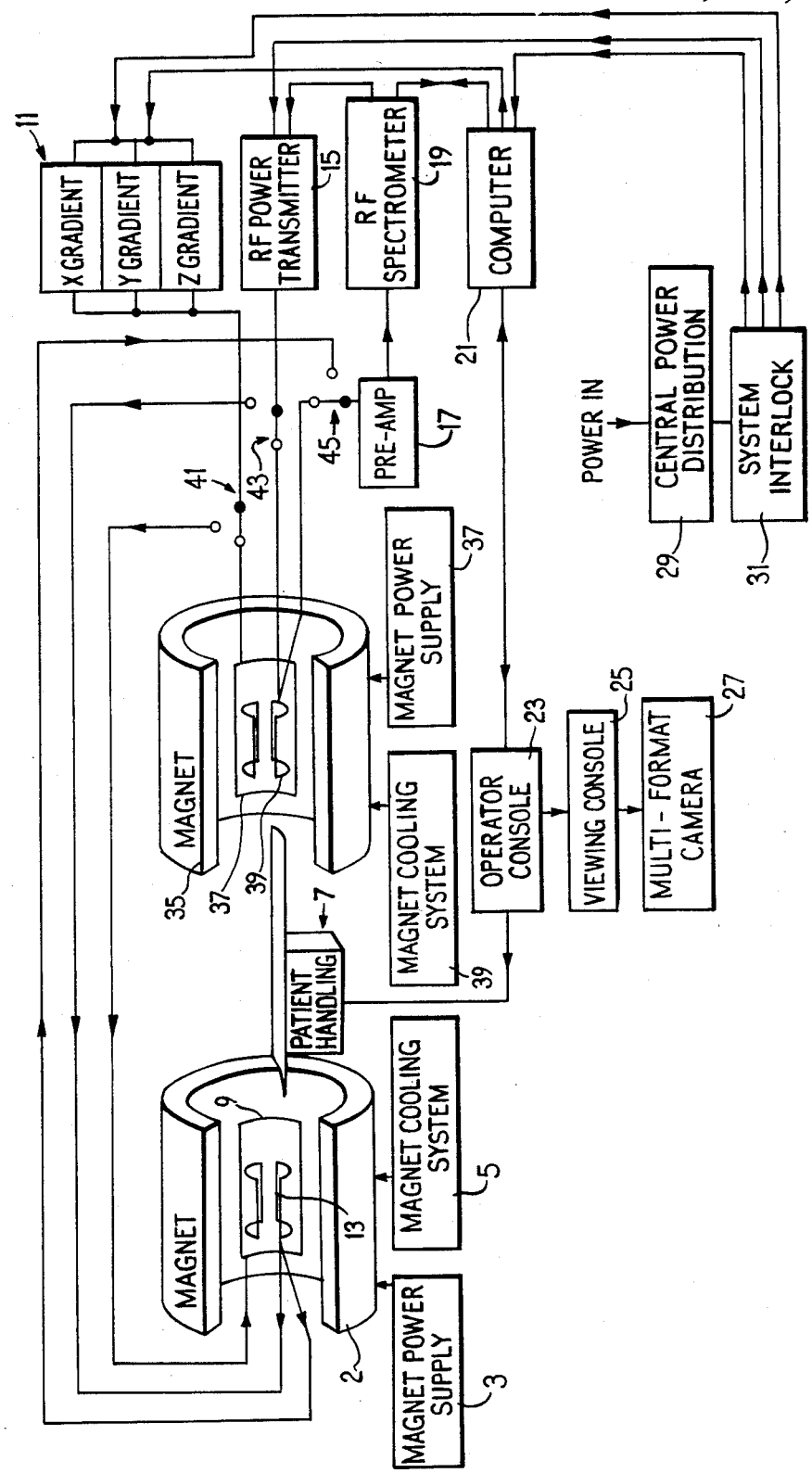
FIG. 1 is a schematic diagram of the apparatus.
Figure 2:
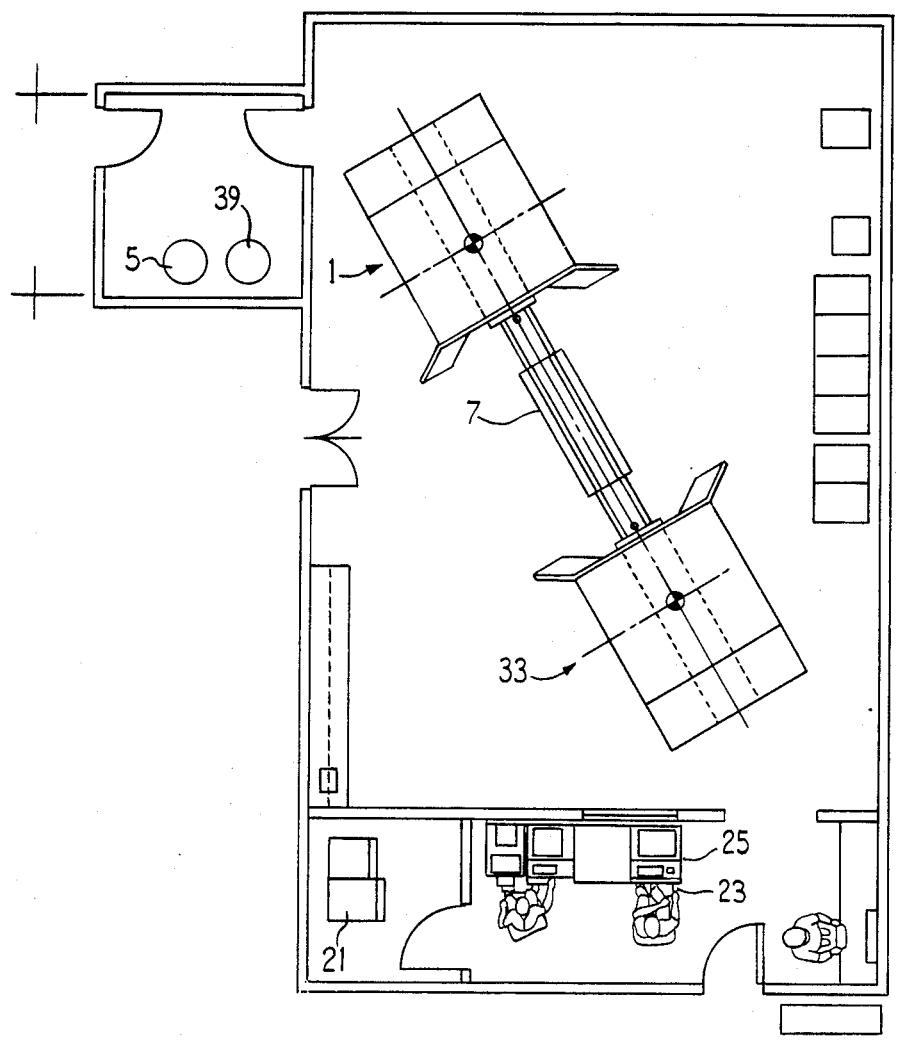
FIG. 2 is a plan view of the apparatus.

The basic form of the apparatus which is designed for the clinical investigation of patients is indicated in FIGS. 1 and 2, and includes a patient examination chamber 1 incorporating a cryogenic magnet system 2, supplied with a power supply 3 and a cooling system 5. The magnet system 2 is capable of providing a steady, homogeneous magnetic field within the chamber 1 along the body of a patient to be examined by the apparatus in a given direction, nominally designated the Z direction, so as to define the equilibrium axis of magnetic alignment of the nuclei within the body along this direction. The strength of this magnetic field is arranged to be suitable for NMR imaging techniques, such as those described in UK Patent Specification No. 1,578,910 or 2,056,078. A patient handling system, indicated as 7, is provided to enable the body to be inserted into the chamber 1. Within the chamber 1 there are also provided three field gradient coils, only one 9 of which is shown, for enabling respective gradients to be applied to the magnetic field applied to the body under examination, along the three orthogonal directions X, Y and Z, under the control of a gradient controller 11. The chamber 1 further includes an r.f. coil system 13 connected to an r.f. power transmitter 15, the coil system 13 enabling r.f. magnetic fields to be applied to the body under examination, and also enabling r.f. magnetic fields resulting from exited nuclei in the body under examination to be detected and fed via a pre-amplifier 17 to an r.f. spectrometer 19. A computer 21 is arranged to analyse the output of the spectrometer 19 under the control of an operator console 23 which is linked to a viewing console 25 and a multi-format camera 27. The apparatus is powered by a central power distribution system 29 via a system interlock 31.

As so far described, the apparatus is of conventional form. The apparatus is however distinguished from conventional apparatus by the provision of a second patient examination chamber 33, positioned at the opposite side of the patient handling system 7 to the chamber 1 such that the body of a patient to be examined may be inserted into either chamber 1 or 33. The second chamber 33 contains a further cryogenic magnet system 35 provided with a power supply 37 and cooling system 39. The magnet system 35 is capable of providing a steady, homogeneous, magnetic field within the chamber 33 along a body inserted in the chamber 33, along a chosen direction again nominally designated the Z direction, of a strength suitable for chemical analysis of the body by NMR spectroscopy. The chamber 33 further includes X, Y and Z magnetic field gradient coils, only one 37 of which is shown, and an r.f. coil system 39. Three two way switches 41, 43, 45 are provided, the switch 41 being effective to selectively connect the gradient coil system in either the first chamber 1 or the second chamber 33 to the gradient controller 11, and the switches 43 and 45 being effective to selectively connect one of the r.f. coil systems 13 or 39 to the r.f. power transmitter 15 and the pre-amplifier 17 respectively.

Thus, in use of the apparatus, either imaging of a body under examination may be carried out in the chamber 1, or a chemical analysis of the body may be carried out in the chamber 33 without the necessity of changing the magnetic field produced by either of the magnet systems 2 or 35. The spectroscopy function within the chamber 33 may be performed by variation of the r.f. field frequency, the incorporation of the gradient coils within the chamber 33 enabling a selected region of the body under examination to be analysed.

It will be appreciated that the field in each chamber 1, 33 may be to some extent affected by the magnet system associated with the other chamber, and this may need to be taken into account in designing the two magnet systems 2, 35.

It will be appreciated that a particular advantage of an apparatus in accordance with the invention is that many parts of the apparatus, in particular computing and associated apparatus for analysing and displaying the detected signals and controlling the applied magnetic field gradients and r.f. excitation pulses, are arranged to be selectively utilised for examination of a body in either one of the two chambers, thereby avoiding the necessity for duplicating large parts of the apparatus.

It will also be appreciated that whilst an apparatus in accordance with the invention has particular application where it is required to perform both chemical analysis and imaging of a body, the invention has equal application where it is required to have two different homogeneous magnetic fields for some other reason, e.g. for different NMR imaging techniques. Thus in some circumstances more than two magnet systems may be provided in an apparatus according to the invention, e.g. two for different imaging techniques and one for chemical analysis.

Whilst the invention has particular application to an NMR apparatus incorporating two cryogenic magnetic systems, it is also applicable to an NMR apparatus incorporating any other form of magnet systems.

I claim:

1. A nuclear magnetic resonance apparatus including at least two systems, each capable of independently providing a homogeneous magnetic field capable of defining an equilibrium axis of magnetic alignment for nuclei within a body to be examined by nuclear magnetic resonance techniques throughout the examination procedure, the strengths of the magnetic fields produced by the systems in operation being different; and control means for operating the apparatus to examine a body using either one of the magnet systems without the other to define a said equilibrium axis within the body.

2. An apparatus in accordance with claim 1 in which a further part of the apparatus is connected to both of the two magnet systems by a switching means, so as to enable the further part to selectively co-operate with either one of the magnet systems.

3. An apparatus in accordance with claim 2 in which the further part includes means for analysing nuclear magnetic resonance signals emitted by a body being examined using either one of the magnet systems.

4. An apparatus in accordance with claim 2 in which the further part includes means for controlling the application of an r.f. magnetic field to a body being examined using either one of the magnet systems.

5. An apparatus in accordance with claim 2 in which the further part includes means for controlling the application of a gradient magnetic field to a body being examined using either one of the magnetic systems.

6. An apparatus in accordance with claim 1 wherein the strength of one of the magnetic fields is of a suitable strength for imaging, and the strength of another of the magnetic fields is of a suitable strength for chemical analysis.

7. An apparatus in accordance with claim 1 in which each magnet system is associated with a separate chamber into which a body to be examined may be placed.

8. An apparatus in accordance with claim 7 in which each chamber is positioned round an area in which the body to be examined may be prepared so as to enable the body to be inserted to any chamber.

* * * * *